(12) United States Patent
Dyer et al.

(10) Patent No.: US 7,504,309 B2
(45) Date of Patent: Mar. 17, 2009

(54) PRE-SILICIDE SPACER REMOVAL

(75) Inventors: Thomas W. Dyer, Pleasant Valley, NY (US); Sunfei Fang, LaGrangeville, NY (US); Jiang Yan, Newburgh, NY (US); Jun Jung Kim, Fishkill, NY (US); Yaocheng Liu, Elmsford, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 11/548,842

(22) Filed: Oct. 12, 2006

(65) Prior Publication Data

US 2008/0090412 A1    Apr. 17, 2008

(51) Int. Cl.
*H01L 21/336* (2006.01)

(52) U.S. Cl. ................. 438/305; 438/278; 438/291; 438/297; 438/300; 438/303; 257/E21.431; 257/E21.434

(58) Field of Classification Search .......... None
See application file for complete search history.

(56) References Cited

U.S. PATENT DOCUMENTS

| | | | |
|---|---|---|---|
| 5,972,764 A * | 10/1999 | Huang et al. | 438/305 |
| 6,284,669 B1 | 9/2001 | Erdeljac et al. | |
| 6,417,056 B1 * | 7/2002 | Quek et al. | 438/303 |
| 6,437,377 B1 | 8/2002 | Ajmera | |
| 6,521,540 B1 | 2/2003 | Li | |
| 7,064,071 B2 | 6/2006 | Schwan | |
| 7,105,429 B2 | 9/2006 | Jawarani | |
| 2006/0046449 A1 | 3/2006 | Liaw | |
| 2006/0108606 A1 | 5/2006 | Saxler et al. | |
| 2006/0125051 A1 | 6/2006 | Liaw | |

* cited by examiner

*Primary Examiner*—N Drew Richards
*Assistant Examiner*—Kyoung Lee
(74) *Attorney, Agent, or Firm*—Gibb I.P. Law Firm, LLC; Yuanmin Cai, Esq.

(57) ABSTRACT

A method forms a gate conductor over a substrate, and simultaneously forms spacers on sides of the gate conductor and a gate cap on the top of the gate conductor. Isolation regions are formed in the substrate and the method implants an impurity into exposed regions of the substrate not protected by the gate conductor and the spacers to form source and drain regions. The method deposits a mask over the gate conductor, the spacers, and the source and drain regions. The mask is recessed to a level below a top of the gate conductor but above the source and drain regions, such that the spacers are exposed and the source and drain regions are protected by the mask. With the mask in place, the method then safely removes the spacers and the gate cap, without damaging the source/drain regions or the isolation regions (which are protected by the mask). Next, the method removes the mask and then forms silicide regions on the gate conductor and the source and drain regions.

6 Claims, 2 Drawing Sheets

PRE-SILICIDE SPACER REMOVAL

BACKGROUND AND SUMMARY

The embodiments of the invention generally relate to transistor manufacturing and more particularly to a method of removing sidewall spacers before silicide has been formed.

In transistors, a gate sidewall spacer is generally used to space the source/drain diffusions and silicide away from the device channel region (the shallow extension implant bridges the gap). Once silicide is formed, the spacer is typically left in place where it may adversely affect subsequent processes. For example, the spacer crowds the limited area between closely spaced gates leaving inadequate room to form good contacts. Also, the presence of the spacer forces the stress liner further from the device channel thereby limiting the effectiveness of stress transfer to the channel.

The problem with simply stripping the nitride spacer after silicide formation is that etchants suitable for nitride removal also erode silicide. Use of a sacrificial nitride deposited preferentially on the silicide has been attempted but the beneficial effect of protecting the silicide tends to be overwhelmed by the need to etch longer to remove both the spacer and the additional nitride from the gate sidewall. The net result is the same or more silicide erosion than the case where no sacrificial nitride is used.

Further, a gate cap nitride is needed for embedded silicon-germanium (eSiGe) processing to prevent epitaxial silicon-germanium (SiGe) deposition on the gate polysilicon. Removal of this cap nitride with exposed silicon and SiGe results in uncontrolled recess of the silicon and SiGe since nitride etchants typically have poor selectivity to silicon and SiGe.

In view of the foregoing, an embodiment of the invention provides a method of forming an integrated circuit transistor. The method forms a gate conductor over a substrate, and simultaneously forms spacers (e.g., nitride) on sides of the gate conductor and a gate cap on the top of the gate conductor. Isolation regions are formed in the substrate (adjacent to the source and drain regions opposite the channel region below the gate conductor) either before or after such structures are formed in and on the substrate. Next, the method implants an impurity into exposed regions of the substrate not protected by the gate conductor and the spacers to form source and drain regions.

Following this, the method deposits a mask over the gate conductor, the spacers, and the source and drain regions. Following this the mask is recessed to a level below a top of the gate conductor, but above the source and drain regions, such that a portion of the spacers are exposed and the source and drain regions are protected by the mask. With the mask in place, the method then safely removes the spacers and the gate cap, without damaging the source/drain regions or the isolation regions (which are protected by the mask). Next, the method removes the mask and then forms silicide regions on the gate conductor and the source and drain regions. This leaves a structure with silicided gate conductor and source/drain regions and no spacers next to the gate conductor.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
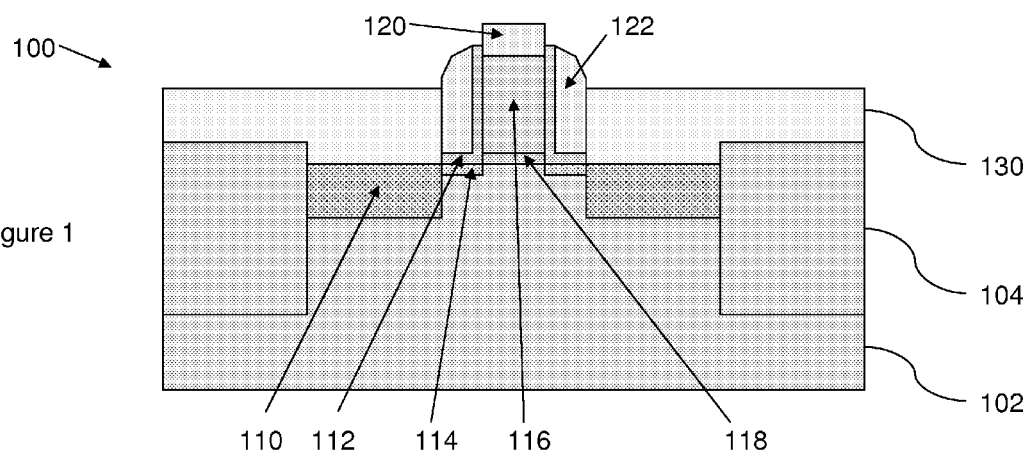
FIG. 1 is a cross-sectional schematic diagram of a partially completed transistor structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As discussed above, the problem with simply stripping the nitride spacer after silicide formation is that etchants suitable for nitride removal also erode silicide. Use of a sacrificial nitride deposited preferentially on the silicide has been attempted but the beneficial effect of protecting the silicide tends to be overwhelmed by the need to etch longer to remove both the spacer and the additional nitride from the gate sidewall. The net result is the same or more silicide erosion than the case where no sacrificial nitride is used.

Figure 2:
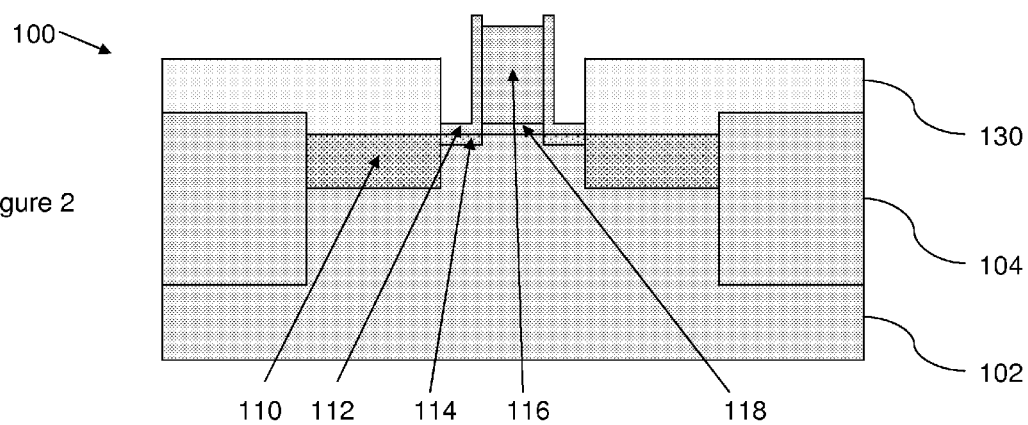
FIG. 2 is a cross-sectional schematic diagram of a partially completed transistor structure.
Figure 3:
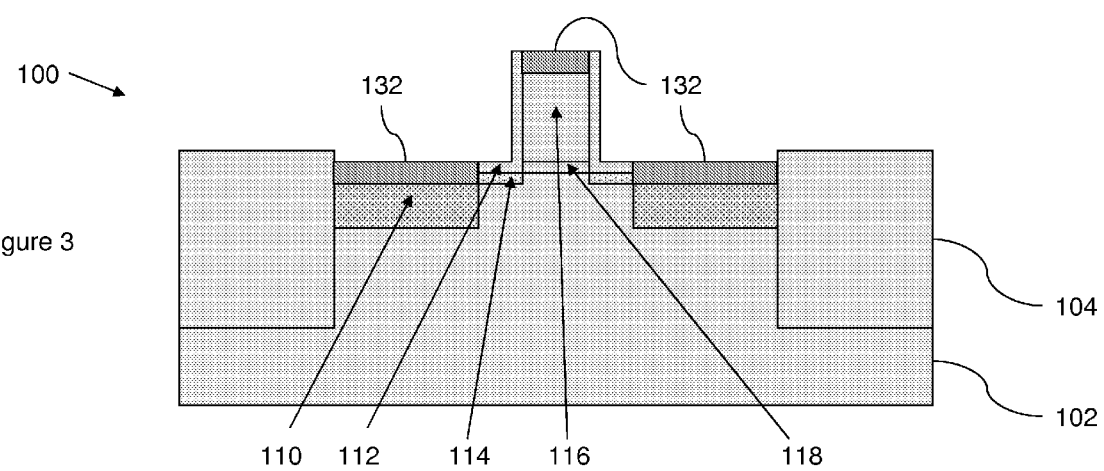
FIG. 3 is a cross-sectional schematic diagram of a partially completed transistor structure.

In view of the foregoing, as shown in FIGS. 1-3, an embodiment of the invention provides a method of forming an integrated circuit transistor 100. The method forms a gate conductor 116 on a gate oxide 118 over a substrate 102, as shown in FIG. 1. An insulator 112 is formed on the gate conductor 116. At different processing stages, various implants are made, such as channel, halo and/or source and drain extensions 114. The method can simultaneously form spacers 122 (e.g., nitride) on sides of the gate conductor 116 and a gate cap (e.g., nitride) on the top of the gate conductor 116.

As further shown in FIG. 1, isolation regions 104 are formed in the substrate 102 (adjacent to the source and drain regions 110, opposite the channel region below the gate conductor 116) either before or after such structures are formed in and on the substrate 102. Next, the method implants an impurity into exposed regions of the substrate 102 not protected by the gate conductor 116 and the spacers 122 to form source and drain regions 110.

Following this, as shown in FIG. 1, the method deposits a mask 130 over the gate conductor 116, the spacers 122, and the source and drain regions 110. Next, the mask 130 is recessed to a level below a top of the gate conductor 116, but above the source and drain regions 110, such that gate cap 120 and the portion of spacers 122 are exposed, and the source and drain regions 110 are protected by the mask 130. With the mask 130 in place, the method then safely removes the spacers 122 and the gate cap 120, without damaging the source/drain regions 110 or the isolation regions 104 (which are protected by the mask 130) as shown in FIG. 2. Next, as shown in FIG. 3, the method removes the mask 130 and then forms silicide regions 132 on the top of the gate conductor 116 and the source and drain regions 110. Note that the insulator 112 (e.g., oxide) prevents the sidewalls of the gate conductor 116 from being silicided.

This leaves a structure with silicided gate conductor 116 and source/drain regions 110 and no spacers next to the gate conductor 116. The structure shown in FIG. 3 is then in condition for further processing, such as additional doping, formation of contacts, insulators, etc.

As mentioned above, a gate cap 120 nitride is needed for the embedded SiGe (eSiGe) processing to prevent epitaxial SiGe deposition on the gate polysilicon 116. Removal of this cap nitride 120 with exposed silicon and eSiGe results in uncontrolled recess of the silicon and eSiGe since nitride etchants typically have poor selectivity to silicon and SiGe. The present method avoids such problems by protecting the silicon and SiGe regions of the source/drain 110 and isolation regions 104 with the mask 130. Further, because the silicide 132 is not formed until after the nitride etch of the spacers 122 and gate cap 120, there is no chance of damaging or eroding the silicide areas 132.

For purposes of this application, the positional terms top, above, over, bottom, below, under, horizontal, vertical, etc. are with respect to the manner in which the transistor is oriented in the drawings. As would be understood by one ordinarily skilled in the art, the transistor structure can be turned on its side, upside-down, etc. without altering the relative positions of the structures discussed herein and the positional terms used herein would change as the structure changes relative positions with respect to the viewer. Therefore, one ordinarily skilled in the art would understand the meaning of such relative positional terms, irrespective of the actual orientation of the transistor with respect to the viewer.

The specifics of processing techniques and materials used in the removal and formation/deposition of the various material layers is discussed in detail in U.S. Pat. Nos. 7,105,429; 7,064,071; 6,437,377; 6,284,669; and 6,521,540 and U.S. Patent Publications 2006/0125051; 2006/0108606; and 2006/0046449 (incorporated herein by reference) and the details of such processing is not discussed in detail herein so as to focus the reader on the salient points of the invention. Further, the method can include other processing steps/structures not mentioned herein that are discussed in the incorporated references.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of forming an integrated circuit transistor, said method comprising:
   forming a gate conductor over a substrate;
   simultaneously forming spacers on sides of said gate conductor and a gate cap on top of said gate conductor;
   implanting an impurity into exposed regions of said substrate not protected by said gate conductor and said spacers to form source and drain regions;
   depositing a mask over said gate conductor, said spacers, and said source and drain regions;
   recessing said mask to a level below a top of said gate conductor and above said source and drain regions such that said gate cap and a portion of said spacers are exposed and said source and drain regions are protected by said mask;
   removing said spacers and said gate cap;
   removing said mask; and
   forming silicide regions on said gate conductor and said source and drain regions.

2. The method according to claim 1, wherein said removing of said spacers simultaneously removes said gate cap.

3. The method according to claim 1, further comprising forming isolation regions in said substrate adjacent said source and drain regions, wherein said mask protects said isolation regions during said removing of said spacers.

4. A method of forming an integrated circuit transistor, said method comprising:
   forming a gate conductor over a substrate;
   simultaneously forming nitride spacers on sides of said gate conductor and a gate cap on top of said gate conductor;
   implanting an impurity into exposed regions of said substrate not protected by said gate conductor and said nitride spacers to form source and drain regions;
   depositing a mask over said gate conductor, said nitride spacers, and said source and drain regions;
   recessing said mask to a level below a top of said gate conductor and above said source and drain regions such that said gate cap and a portion of said nitride spacers are exposed and said source and drain regions are protected by said mask;
   removing said nitride spacers;
   removing said mask and said gate cap; and
   forming silicide regions on said gate conductor and said source and drain regions.

5. The method according to claim 4, wherein said removing of said nitride spacers simultaneously removes said nitride gate cap.

6. The method according to claim 4, further comprising forming isolation regions in said substrate adjacent said source and drain regions, wherein said mask protects said isolation regions during said removing of said nitride spacers.

* * * * *

UNITED STATES PATENT AND TRADEMARK OFFICE
CERTIFICATE OF CORRECTION

PATENT NO. : 7,504,309 B2  Page 1 of 1
APPLICATION NO. : 11/548842
DATED : March 17, 2009
INVENTOR(S) : Thomas Dyer et al.

It is certified that error appears in the above-identified patent and that said Letters Patent is hereby corrected as shown below:

Title Page; should read:
(73) Assignee: International Business Machines Corporation    Armonk, NY (US)
               Samsung Electronics Co., Ltd.                  Suwon-Si Gyeonggi-Do
                                                              Republic of Korea
               Infineon Technologies North America Corporation    Milpitas, CA (US)

Signed and Sealed this

Eighth Day of June, 2010

David J. Kappos
*Director of the United States Patent and Trademark Office*